(12) United States Patent
Roy et al.

(10) Patent No.: US 11,177,174 B2
(45) Date of Patent: Nov. 16, 2021

(54) SELECTIVE DEPOSITION OF CARBON FILMS AND USES THEREOF

(71) Applicant: Applied Materials, Inc., Santa Clara, CA (US)

(72) Inventors: Susmit Singha Roy, Sunnyvale, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/690,652

(22) Filed: Nov. 21, 2019

(65) Prior Publication Data

US 2020/0168503 A1 May 28, 2020

Related U.S. Application Data

(60) Provisional application No. 62/771,011, filed on Nov. 23, 2018.

(51) Int. Cl.
| | | |
|---|---|---|
| *H01L 21/768* | (2006.01) | |
| *H01L 21/02* | (2006.01) | |
| *H01L 21/311* | (2006.01) | |
| *H01L 21/321* | (2006.01) | |
| *H01L 21/3105* | (2006.01) | |

(52) U.S. Cl.
CPC .. *H01L 21/76897* (2013.01); *H01L 21/02115* (2013.01); *H01L 21/02205* (2013.01); *H01L 21/02271* (2013.01); *H01L 21/31111* (2013.01); *H01L 21/76802* (2013.01); *H01L 21/76834* (2013.01); *H01L 21/76877* (2013.01); *H01L 21/31053* (2013.01); *H01L 21/3212* (2013.01); *H01L 21/7684* (2013.01); *H01L 21/76819* (2013.01)

(58) Field of Classification Search
CPC ......... H01L 21/76897; H01L 21/02115; H01L 21/02205; H01L 21/02271; H01L 21/31111; H01L 21/76802; H01L 21/76834; H01L 21/76877; H01L 21/31053; H01L 21/3212; H01L 21/76819; H01L 21/7684
See application file for complete search history.

(56) References Cited

U.S. PATENT DOCUMENTS

| | | |
|---|---|---|
| 9,768,032 B2 | 9/2017 | Park |
| 10,428,421 B2 | 10/2019 | Haukka et al. |

(Continued)

FOREIGN PATENT DOCUMENTS

| | | |
|---|---|---|
| KR | 20170016310 A | 2/2017 |
| WO | 2012135379 A1 | 10/2012 |

OTHER PUBLICATIONS

Batzill, Matthias, "The surface science of graphene: Metal interfaces, CVD synthesis, nanoribbons, chemical modifications, and defects", Surface Science Reports 67 (2012), Dec. 1, 2011, 83-115.

(Continued)

*Primary Examiner* — Peniel M Gumedzoe
(74) *Attorney, Agent, or Firm* — Servilla Whitney LLC

(57) ABSTRACT

Methods of depositing a carbon film are discussed. Some embodiments selectively deposit a carbon film on a metal surface over a dielectric surface. Some embodiments form carbon pillars on metal surfaces selectively over dielectric surfaces. Some embodiments utilize carbon pillars in forming self-aligned vias.

20 Claims, 7 Drawing Sheets

(56) References Cited

U.S. PATENT DOCUMENTS

| | | |
|---|---|---|
| 2010/0297848 A1 | 11/2010 | Breitwisch et al. |
| 2011/0198736 A1* | 8/2011 | Shero ................ C23C 16/45525 257/629 |
| 2015/0380302 A1 | 12/2015 | Mountsier et al. |
| 2016/0322213 A1* | 11/2016 | Thompson ............. G03G 15/50 |
| 2017/0287827 A1* | 10/2017 | Bryks ................ H01L 21/4857 |
| 2018/0218914 A1 | 8/2018 | Basu et al. |

OTHER PUBLICATIONS

Brukh, Roman, et al., "Mechanism of carbon nanotube growth by CVD", Chemical Physics Letters 424 (2006), Apr. 22, 2006, 126-132.

Kumar, Mukul, "Carbon Nanotube Synthesis and Growth Mechanism", Carbon Nanotubes—Synthesis, Characterization, Applications, Jul. 20, 2011, 147-170.

Kurlov, A.S., et al., "Tungsten Carbides and W—C Phase Diagram", Inorganic Materials, 2006, vol. 42, No. 2, May 17, 2005, 121-127.

Li, Pan, et al., "CVD Growth of Carbon Nanotube Forest with Selective Wall-Number from Fe—Cu Catalyst", The Journal of Physical Chemistry, C. 2016, 120, May 2, 2016, 11163-11169.

Seah, Choon-Ming, et al., "Mechanisms of graphene growth by chemical vapour deposition on transition metals", Elsevier Journal, Jan. 3, 2014, 1-21.

Zhong, Guofang, et al., "Single-step CVD growth of high-density carbon nanotube forests on metallic Ti coatings through catalyst engineering", 1-26.

PCT International Search Report and Written Opinion in PCT/US2019/062579 dated Mar. 19, 2020, 11 pages.

\* cited by examiner

SELECTIVE DEPOSITION OF CARBON FILMS AND USES THEREOF

CROSS-REFERENCE TO RELATED APPLICATIONS

This application claims priority to U.S. Provisional Application No. 62/771,011, filed Nov. 23, 2018, the entire disclosure of which is hereby incorporated by reference herein.

TECHNICAL FIELD

Embodiments of the present disclosure generally relate to methods and materials for selectively depositing carbon films. Some embodiments of the disclosure relate to methods for forming carbon pillars. Some embodiments of the disclosure relate to methods for forming a self-aligned via.

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

Therefore, there is an ongoing need in the art for methods to selectively deposit films. More specifically, there is a need for methods which selectively deposit carbon films.

Self-aligned metal oxide pillars can be formed through the oxidation of gap-filled metal films. Metal is deposited on the structure of holes or trenches and then oxidized to form metal oxides. The volume expansion during oxidization pushes a pillar out of the holes or trenches. The pillars are selectively grown from the bottom-up from metal only.

However, there may be challenges controlling the rate and amount of volume expansion of the metal to form the metal oxide columns. First, rapid changes in stress sometimes lead to degradation of the inherent structure. This can lead to bending of tall columns when the CD is small. Second, rapid change in the volume sometimes leads to adhesion issues between the metal oxide pillar and the substrate. Third, residual, un-oxidized, metal may remain at the bottom of the trench.

Therefore, there is a need in the art for alternative methods to create self-aligned structures.

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the integrated circuit decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide full via self-alignment. In the conventional techniques, the vias formed to connect lines in an upper metallization layer to a lower metallization are often misaligned to the lines in the lower metallization layer. The via-line misalignment increases via resistance and leads to potential shorting to the wrong metal line. The via-line misalignment causes device failures, decreases yield and increases manufacturing cost.

Therefore, there is need in the art for a method of producing fully self-aligned vias.

SUMMARY

One or more embodiments of the disclosure are directed to a method of selectively depositing a carbon film. The method comprises providing a substrate comprising a first material and a second material. The first material has an exposed first material surface. The second material has an exposed second material surface. The first material comprises a metal. The substrate is exposed to a carbon precursor to form a carbon film with a first thickness on the exposed first material surface and a second thickness on the exposed second material surface. The first thickness is greater than the second thickness.

Additional embodiments of the disclosure are directed to a method of forming a carbon pillar. The method comprises providing a substrate comprising a first metal-containing material and a second dielectric material. The first metal-containing material has an exposed first surface with a first dimension. The second dielectric material has an exposed second surface. The exposed first surface and the exposed second surface form a substrate surface. The substrate is exposed to a carbon precursor to form a carbon pillar comprising a carbon material on the exposed first surface. The carbon pillar and the exposed first surface have the same first dimension.

Further embodiments of the disclosure are directed to a method of forming a self-aligned via. The method comprises recessing first conductive lines on a first insulating layer on a substrate. The first conductive lines extend along a first direction on the first insulating layer. Carbon pillars are formed on the recessed first conductive lines. A second insulating layer is deposited between the carbon pillars. The carbon pillars are removed to form trenches in the second insulating layer. A third insulating layer is deposited in the trenches onto the recessed first conductive lines to form filled trenches. The third insulating layer is selectively etched from the filled trenches to form a via opening to the first conductive line.

Figure 1A:
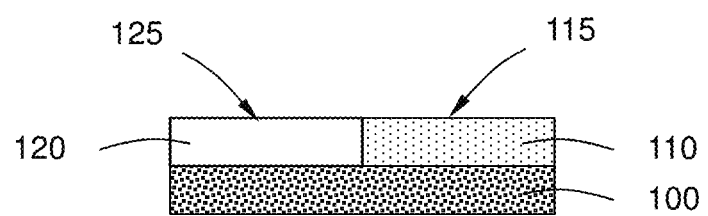
FIG. 1A illustrates an exemplary substrate for selectively depositing a carbon film according to some embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process routines set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer may also be described as the substrate surface. The composition of a given substrate surface will depend on the materials to be deposited, as well as the particular chemistry used.

As used in this specification and the appended claims, the terms "precursor", "reactant", "reactive gas" and the like are used interchangeably to refer to any gaseous species that can react with the substrate surface.

Some embodiments of the disclosure provide methods for selectively depositing a carbon film. In some embodiments, the carbon film is selectively deposited on a metal-containing surface over a different surface. As used in this specification and the appended claims, the phrase "selectively depositing a film on one surface over another surface", and the like, means that a first amount of the film is deposited on the first surface and a second amount of film is deposited on the second surface, where the second amount of film is less than the first amount of film, or no film is deposited on the second surface.

The term "over" used in this regard does not imply a physical orientation of one surface on top of another surface, rather a relationship of the thermodynamic or kinetic properties of the chemical reaction with one surface relative to the other surface. For example, selectively depositing a carbon film onto a metal surface over a dielectric surface means that the carbon film deposits on the metal surface and less or no carbon film deposits on the dielectric surface; or that the formation of a carbon film on the metal surface is thermodynamically or kinetically favorable relative to the formation of a carbon film on the dielectric surface.

Some embodiments of the disclosure advantageously provide methods for selectively depositing a carbon film on a first surface over a second surface. Some embodiments of the disclosure provide methods for depositing a carbon film which are performed at relatively low temperatures. Some embodiments of the disclosure advantageously provide methods of depositing a carbon film without the use of plasma reactants or treatments. In some embodiments, the first surface comprises a metal and the second surface comprises a dielectric material.

Referring to the Figures, FIG. 1A shows an exemplary substrate 100 in accordance with one or more embodiment of the disclosure. The substrate 100 comprises a first material 110 and a second material 120. The first material 110 has an exposed first material surface 115. The second material 120 has an exposed second material surface 125.

The first material 110 comprises a metal. In some embodiments, the metal comprises or consists essentially of one or more of Ti, Co, Ni, Cu, Ru, Rh, Pd, Ag, Hf, Ta, W, Re, Ir, Pt, or Au. In some embodiments, the metal comprises or consists essentially of one or more of Ti, Hf, Ta, or W. In some embodiments, the metal comprises or consists essentially of one or more of Co, Ni, Ru, Rh, Pd, or Re. In some embodiments, the metal comprises or consists essentially of one or more of Cu, Pd, Ag, Ir, Pt, or Au. As used in this specification and the appended claims, the term "consists essentially of", and the like, means that the subject material or composition is greater than or equal to about 95%, 98%, 99% or 99.5% of the stated material.

In some embodiments, the first material 110 comprises a substantially pure metal or metal alloy. Stated differently, the first material 110 may consist essentially of metal atoms. In some embodiments, the first material 110 comprises metallic elements and non-metallic elements. In some embodiments, the first material 110 comprises a metal nitride, metal carbide, metal silicide, metal oxide, metal sulfide, metal selenide, metal telluride or combinations thereof.

In some embodiments, the second material 120 comprises a dielectric material. In some embodiments, the second material 120 comprises silicon.

Figure 2:
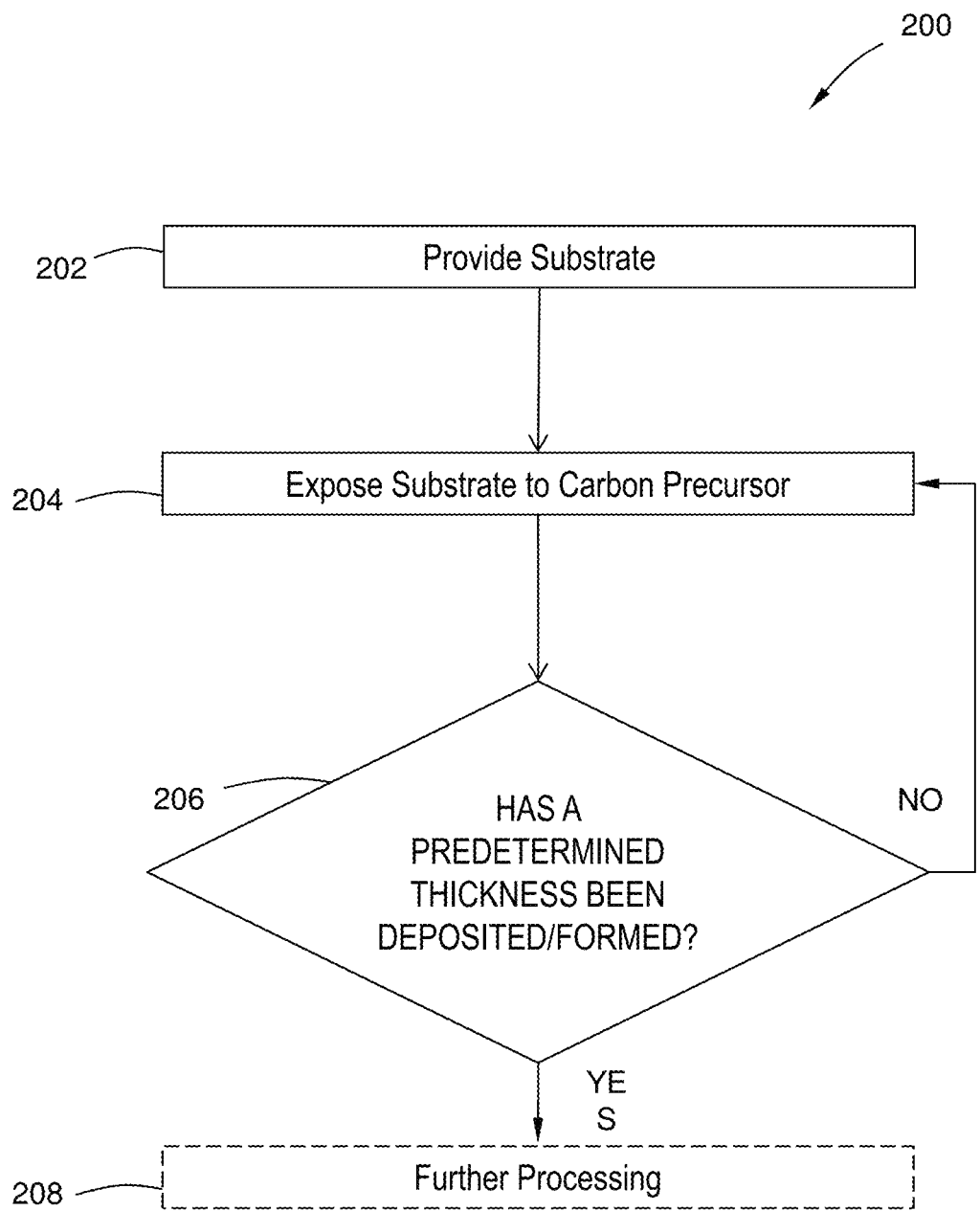
FIG. 2 illustrates a method for selectively depositing a carbon film or forming a carbon pillar according to some embodiments.

FIG. 2 illustrates a method for forming a carbon film on a substrate 100 in accordance with one or more embodiment of the disclosure. The method 200 generally begins at 202, where a substrate upon which a carbon film is to be formed is provided. As used in this regard, the term "provided" means that the substrate is placed into a position or environment for further processing.

Figure 1B:
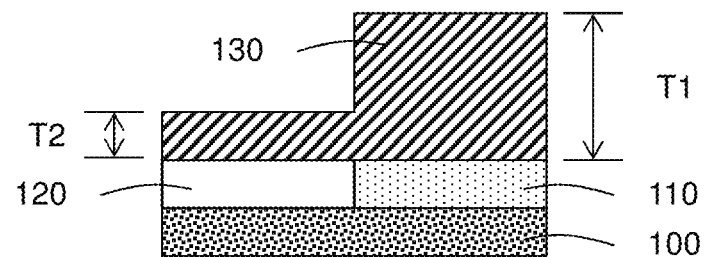
FIG. 1B illustrates an exemplary substrate with a carbon film selectively deposited thereon according to some embodiments.

At 204, a carbon film is formed on the substrate 100. The carbon film may be formed via a chemical vapor deposition process (CVD), or the like. Referring also to FIG. 1B, at 204, the substrate 100 is exposed to a carbon precursor to form a carbon film 130 with a first thickness T1 on the exposed first material surface 115 and a second thickness T2 on the exposed second material surface 125. The first thickness T1 is greater than the second thickness T2. For the sake of understanding, the second thickness T2 is illustrated in FIG. 1B. In some embodiments, the second thickness T2 is minimal or none.

The selectivity of a deposition process is generally expressed as a multiple of growth rate. For example, if a film is grown on one surface 25 times faster than on a different surface, the process would be described as having a selectivity of 25:1. In this regard, higher ratios indicate more selective processes. In some embodiments, the method has a selectivity of greater than or equal to about 10:1, greater than or equal to about 25:1, greater than or equal to about 50:1, or greater than or equal to about 100:1.

The carbon precursor may comprise any suitable carbon-containing species. In some embodiments, the carbon precursor consists essentially of carbon and hydrogen atoms. In some embodiments, the carbon precursor comprises a C1-C4 hydrocarbon, a C1-C6 hydrocarbon or a C1-C8 hydrocarbon. As used in this regard, C1-C4, and the like, refers to a species with a number of carbon atoms in a range of 1 to 4. In some embodiments, the carbon precursor comprises at least one unsaturated bond. In some embodiments, the carbon precursor comprises or consists essentially of one or more of $C_2H_2$, $C_2H_4$, $C_3H_6$, or $CH_4$. For gaseous compositions, the term "consists essentially of" refers to the active component of the composition, not including diluent, carrier or inert gases.

In some embodiments, the substrate is exposed to a carbon precursor comprising an additional reactant or diluent. In some embodiments, the additional reactant or diluent comprises or consists essentially of hydrogen gas ($H_2$), nitrogen gas ($N_2$) or argon gas (Ar). In some embodiments, when provided as part of the carbon precursor, hydrogen gas ($H_2$) is not provided as diluent, carrier or inert gasses.

The flow rate of the carbon precursor can be any suitable flow rate including, but not limited to, flow rates is in the range of about 1 to about 5000 sccm, or in the range of about 2 to about 4000 sccm, or in the range of about 3 to about 3000 sccm, or in the range of about 5 to about 2000 sccm, or in the range of about 10 to about 2000 sccm.

The carbon precursor can be provided so as to establish any suitable pressure around the substrate (i.e. within a processing chamber) including, but not limited to, a pressure in the range of about 1 Torr to about 3000 Torr, or in the range of about 2 Torr to about 1500 Torr, or in the range of about 100 Torr to about 1000 Torr, or in the range of about 500 Torr to about 1000 Torr. In some embodiments, the substrate is exposed to the carbon precursor at about atmospheric pressure (e.g. 760 Torr).

The temperature of the substrate during deposition can be controlled, for example, by setting the temperature of a substrate support or susceptor. In some embodiments the substrate is held at a temperature in the range of about 100° C. to about 700° C., or in the range of about 100° C. to about 500° C., or in the range of about 300° C. to about 500° C. In some embodiments, the substrate is maintained at a temperature less than or equal to about 700° C., less than or equal to about 500° C. or less than or equal to about 300° C.

The period of time that the substrate is exposed to the carbon precursor gas may be any suitable amount of time necessary to allow a predetermined thickness of carbon film to form on the exposed first material surface. For example, the substrate may be exposed to the carbon precursor for a period of about 10 minutes to about 5 hours, or a period of about 30 minutes to about 3 hours or a period of about 1 hour to about 2 hours.

In some embodiments, the carbon film is formed at a rate of greater than or equal to about 20 nm/hour, greater than or equal to 25 nm/hour, greater than or equal to about 30 nm/hour, greater than or equal to about 40 nm/hour, or greater than or equal to about 50 nm/hour. In some embodiments, the carbon film is formed at a rate in a range of about 25 nm/hour to about 50 nm/hour.

In some embodiments, method of selectively depositing the carbon film is performed as a thermal process without the use of plasma reactants. Stated differently, in some embodiments, the method is performed without plasma.

Next, at 206, it is determined whether the metal film has achieved a predetermined thickness. If the predetermined thickness has not been achieved, the method 200 returns to 204 to continue forming the metal film until the predetermined thickness is reached. Once the predetermined thickness has been reached, the method 200 can either end or proceed to 208 for optional further processing.

Some embodiments of the disclosure provide methods for forming a carbon pillar. In some embodiments, the carbon pillar is selectively formed on a metal-containing surface over a different surface.

Some embodiments of the disclosure advantageously provide methods for forming a carbon pillar on a first surface over a second surface. Some embodiments of the disclosure provide methods for forming a carbon pillar which are performed at relatively low temperatures. Some embodiments of the disclosure advantageously provide methods of forming a carbon pillar without the use of plasma reactants or treatments. Some embodiments of the disclosure provide methods of forming a carbon pillar which provide a pillar without a "mushroom" effect. In some embodiments, the first surface comprises a metal and the second surface comprises a dielectric material.

Figure 3A:
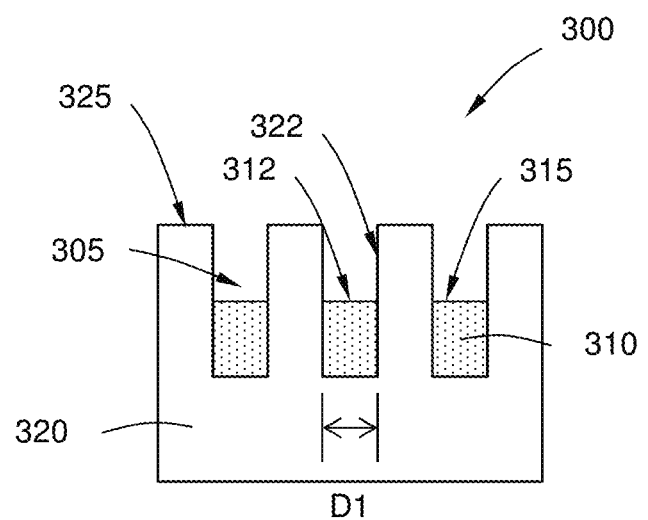
FIG. 3A illustrates an exemplary substrate for forming a carbon pillar according to some embodiments.

Referring to the Figures, FIG. 3A shows an exemplary substrate 300 in accordance with one or more embodiment of the disclosure. The substrate 300 comprises a first material 310 and a second material 320. The first material 310 has an exposed first surface 315 with a first material dimension D1. The second material 320 has an exposed second surface 325. The exposed first surface 315 and the exposed second surface 325 form the substrate surface. In some embodiments, the first material 310 comprises a metal-containing material. In some embodiments, the second material 320 comprises a dielectric material. Accordingly, the first material 310 may be referred to as the first metal-containing material, and the second material 320 may be referred to as the second dielectric material.

The first material 310 comprises a metal. In some embodiments, the metal comprises or consists essentially of one or more of Co, Ni, Ru, Rh, Pd, or Re. Without being bound by theory, the inventors have found that these metal both catalyze the deposition of carbon and have a high level of carbon solubility. These factors combine to allow for a deposition method from a vapor precursor to a dissolved carbon species to solid precipitated carbon pillar. Without being bound by theory, it is believed that this mechanism provides for orthogonal growth rather than mushrooming of the carbon pillars.

In some embodiments, the first material 310 comprises a substantially pure metal or metal alloy. Stated differently, the first material 310 may consist essentially of metal atoms. In some embodiments, the first material 310 comprises metallic elements and non-metallic elements. In some embodiments, the first material 310 comprises a metal nitride, metal carbide, metal silicide, metal oxide, metal sulfide, metal selenide, metal telluride or combinations thereof.

In some embodiments, the second material 320 comprises a dielectric material. In some embodiments, the second material 320 comprises silicon.

In some embodiments, as shown in FIG. 3A, the exposed first surface 315 is recessed from the exposed second surface 325 to form a substrate feature 305. The substrate feature 305 comprises at least one sidewall 322 of the second material 320 and a bottom 312 of the first material 310 having an exposed first surface 315.

Alternatively, in some embodiments, the substrate 300 does not contain a feature 305 as shown in FIG. 3A. For these embodiments the substrate 300 may appear as substrate 100 in FIG. 1A. Stated differently, in some embodiments, the exposed first surface is substantially coplanar with the exposed second surface. As used in this specification and the appended claims, the term "substantially coplanar" means that the exposed first surface and the exposed second surface are coplanar within ±2 nm.

The method for forming the carbon pillar is similar to the method for forming the carbon film shown in FIG. 2. The method 200 generally begins at 202, where a substrate upon which a carbon pillar is to be formed is provided.

Figure 3B:
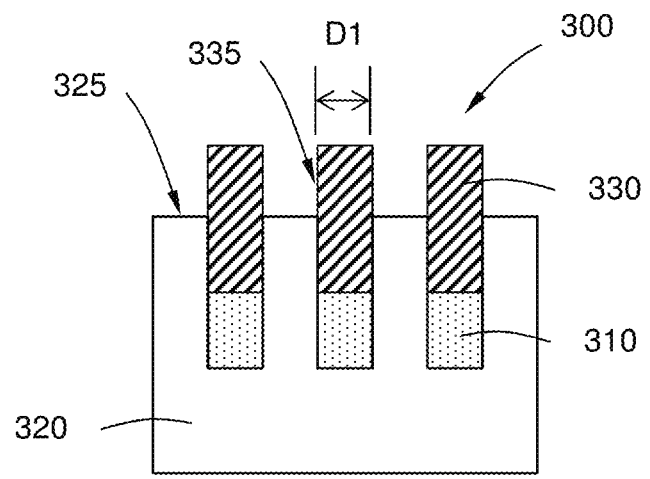
FIG. 3B illustrates an exemplary substrate with a carbon pillar formed thereon according to some embodiments.

At 204, a carbon pillar is formed on the substrate. The carbon pillar may be formed via a chemical vapor deposition process (CVD), or the like. Referring also to FIG. 3B, at 204, the substrate 300 is exposed to a carbon precursor to form a carbon pillar 330 comprising a carbon material. The carbon pillar 330 extends above the exposed second surface 325. The carbon pillar 330 has substantially the same first dimension D1 as the exposed first surface 315. In some embodiments, substantially no carbon material is deposited on the exposed second surface 325.

In some embodiments, the carbon pillar 330 has sides 335 which are substantially orthogonal to the substrate surface. In some embodiments, the carbon pillar 330 has sides 335 which are substantially orthogonal to the exposed second surface 325. As used in this regard, two surfaces may be described as substantially orthogonal when the angle formed at the junction of the surfaces is 90°±10°.

The reactants and process parameters described above for the selective deposition of a carbon film are the same reactants and process parameters for the formation of the carbon pillar.

Next, at 206, it is determined whether the carbon pillar has achieved a predetermined thickness. If the predetermined thickness has not been achieved, the method 200 returns to 204 to continue forming the carbon pillar until the predetermined thickness is reached. Once the predetermined thickness has been reached, the method 200 can either end or proceed to 208 for optional further processing.

Some embodiments of the disclosure provide methods to form fully self-aligned vias. In one embodiment, a first metallization layer comprising a set of first conductive lines extending along a first direction on a first insulating layer on a substrate is formed. A second insulating layer is formed on the first insulating layer. A second metallization layer comprising a set of second conductive lines on a third insulating layer above the first metallization layer is formed. The set of second conductive lines extend along a second direction. A via is formed between the first metallization layer and the second metallization layer. The via is self-aligned along the second direction to one of the first conductive lines. The via is self-aligned along the first direction to one of the second conductive lines, as described in further detail below. In one embodiment, the first and second directions cross each other at an angle. In one embodiment, the first direction and second direction are substantially orthogonal to each other.

In one embodiment, a fully self-aligned via is fabricated using a selective pillar deposition technique. In one embodiment, the conductive lines on a first insulating layer on a substrate are recessed. The conductive lines extend along a first direction on the first insulating layer. Pillars are formed on the recessed conductive lines. A second insulating layer is deposited between the pillars. The pillars are removed to form trenches. A third insulating layer is deposited on the second insulating layer and into the trenches. The third insulating layer is selectively etched relative to the second insulating layer form a via opening down to one of the conductive lines, as described in further detail below.

In one embodiment, a fully self-aligned via is a via that is self-aligned along at least two directions to the conductive lines in a lower and an upper metallization layers. In one embodiment, the fully self-aligned via is defined by a hard mask in one direction and the underlying insulating layer in another direction, as described in further detail below.

One or more embodiments provide fully self-aligned vias that advantageously eliminate the via misalignment issues and avoid shorting to the wrong metal line. The fully self-aligned vias provide lower via resistance and capacitance benefits over the conventional vias. Embodiments of the self-aligned vias provide full alignment between the vias and the conductive lines of the metallization layers that is substantially error free that advantageously increase the device yield and reduce the device cost.

When vias are printed close together—closer than the minimum pitch that can be obtained by lithography—the via mask layer set are split into multiple masks. For example, instead of defining via to metal in a single litho-etch sequence, two or more litho-etch sequences are used to avoid shorting the closely spaced vias. Some embodiments of the disclosure are directed to pillar growth processes in which all vias are defined as the cross-over between two metal layers so that adjacent vias will not short to each other. In some embodiments, multiple vias can be defined using one large lithography feature placed over multiple cross points. In this case, all areas where the metal layers overlap under the defined large lithography opening will form a via.

Further, the disclosed methods advantageously provide pillar which are easier to remove than metal oxide pillars. In some embodiments, the carbon pillars are removed by a dry etch process. Without being bound by theory, it is believed that the dry etch processes utilized to remove the carbon pillars are easier to perform than oxygen based ashing processes typically utilized to etch metal oxide materials.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

One or more embodiments of the disclosure are directed to methods and apparatus to provide fully self-aligned vias. The various aspects of the disclosure are described with respect to a detailed process illustrated in the Figures. Those skilled in the art will understand that the scope of the disclosure is not limited to the particular details described in the Figures and that some portions of the process can be altered or omitted.

Figure 4:
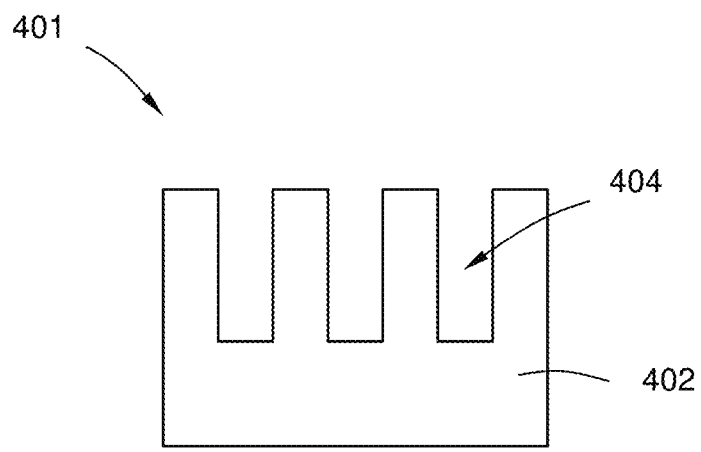
FIG. 4 illustrates a cross-sectional view of an electronic device structure to provide a fully self-aligned via according to some embodiments.
Figure 5:
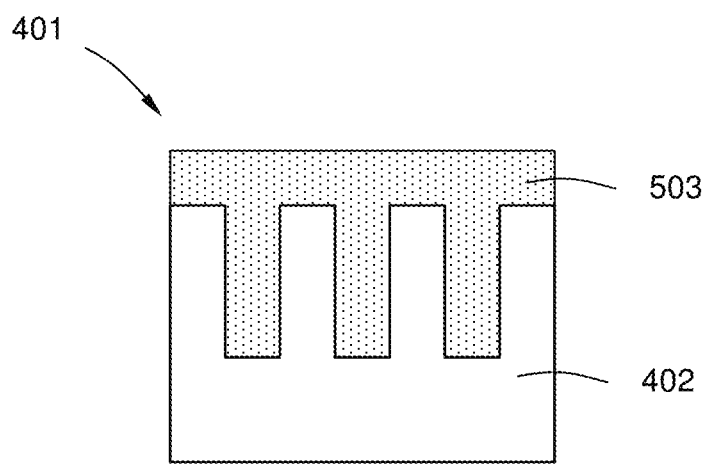
FIG. 5 is a cross-sectional view of the electronic device structure after a conductive material is deposited according to some embodiments.
Figure 6:
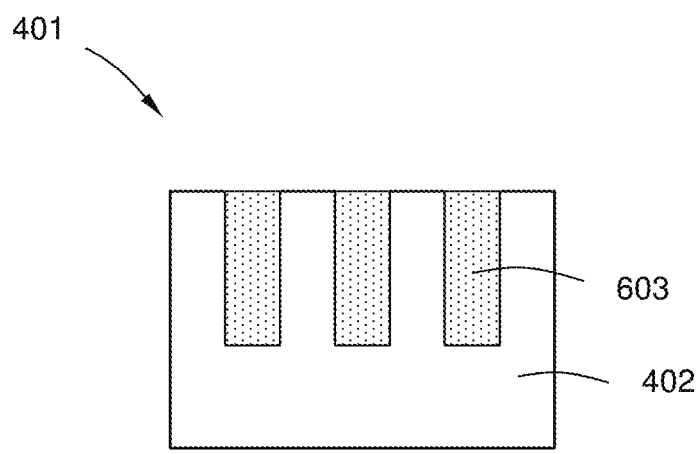
FIG. 6 is a cross-sectional view of the electronic device structure after the conductive material is planarized to form conductive lines according to some embodiments.

FIGS. 4-6 illustrates a cross-sectional view of a substrate 401 to provide a fully self-aligned via or air gap according to some embodiments. Referring to FIG. 6, a lower metallization layer (Mx) comprises a set of conductive lines 603 that extend along an axis on an insulating layer 402 on a substrate 401. The method may begin with FIG. 4, where trenches 404 are formed in an insulating layer 402. Referring to FIG. 5, conductive layer 503 are deposited in trenches 404. Referring to FIG. 6, if necessary, the first conductive layer 403 are planarized to the surface of the insulating layer 402.

In some embodiments, the substrate 401 comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In some embodiments, substrate 401 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 401 can be, for example, an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, substrate 401 includes one or more metallization interconnect layers for integrated circuits. In some embodiments, the substrate 401 includes interconnects, for example, vias, configured to connect the metallization layers. In some embodiments, the substrate 401 includes electronic devices, e.g., transistors, memories, capacitors, resistors, optoelectronic devices, switches, and any other active and passive electronic devices that are separated by an electrically insulating layer. For example, an interlayer dielectric, a trench insulation layer or any other insulating layer known to one of ordinary skill in the art of the electronic device manufacturing. In some embodiments, the substrate includes one or more buffer layers to accommodate for a lattice mismatch between the substrate 401 and one or more layers above substrate 401 and to confine lattice dislocations and defects.

Insulating layer 402 can be any material suitable to insulate adjacent devices and prevent leakage. In some embodiments, electrically insulating layer 402 is an oxide layer, e.g., silicon dioxide, or any other electrically insulating layer determined by an electronic device design. In some embodiments, insulating layer 402 comprises an interlayer dielectric (ILD). In some embodiments, insulating layer 402 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride or any combination thereof.

In some embodiments, insulating layer 402 includes a dielectric material having k value less than 5. In some embodiments, insulating layer 402 includes a dielectric material having k-value less than 2. In some embodiments, insulating layer 402 includes a nitride, oxide, a polymer, phosphosilicate glass, fluorosilicate (SiOF) glass, organosilicate glass (SiOCH), other electrically insulating layer determined by an electronic device design, or any combination thereof. In some embodiments, insulating layer 402 may include polyimide, epoxy, photodefinable materials, such as benzocyclobutene (BCB), and WPR-series materials, or spin-on-glass.

In some embodiments, insulating layer 402 is a low-k interlayer dielectric to isolate one metal line from other metal lines on substrate 401. In some embodiments, the thickness of the insulating layer 402 is in an approximate range from about 10 nanometers (nm) to about 2 microns (μm).

In some embodiments, insulating layer 402 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In some embodiments, the composition of the insulating layer 402 is analogous to the second material 120 described above.

In some embodiments, the lower metallization layer Mx comprising conductive lines 603 is a part of a back end metallization of the electronic device. Referring to FIG. 4, in some embodiments, the insulating layer 402 is patterned and etched using a hard mask to form trenches 404 using one or more patterning and etching techniques known to one of ordinary skill in the art of microelectronic device manufacturing. In some embodiments, the size of trenches 404 in the insulating layer 402 is determined by the size of conductive lines 603 formed later on in a process.

In some embodiments, forming the conductive lines 603 involves filling the trenches 404 with a layer of conductive material. In some embodiments, a base layer (not shown) is first deposited on the internal sidewalls and bottom of the trenches 404, and then the conductive layer 503 is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer 402. Additionally, the conductive barrier layer can be used to provide adhesion for the seed layer (e.g., copper).

In some embodiments, to form the base layer, the conductive barrier layer is deposited onto the sidewalls and bottom of the trenches 404, and then the seed layer is deposited on the conductive barrier layer. In another embodiment, the conductive base layer includes the seed layer that is directly deposited onto the sidewalls and bottom of the trenches 404. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the conductive layer 503 e.g., copper, is deposited onto the seed layer of base layer of copper, by an electroplating process. In some embodiments, the conductive layer is deposited into the trenches 404 using a damascene process known to one of ordinary skill in the art of microelectronic device manufacturing. In one embodiment, the conductive layer is deposited onto the seed layer in the trenches 404 using a selective deposition technique, such as but not limited to electroplating, electroless, a CVD, PVD, MBE, MOCVD, ALD, spin-on, or other deposition techniques known to one of ordinary skill in the art of microelectronic device manufacturing.

In some embodiments, the choice of a material for conductive layer 503 for the conductive lines 603 determined the choice of a material for the seed layer. For example, if the material for the conductive lines 1003 includes copper, the material for the seed layer also includes copper. In some embodiments, the conductive lines 603 include a metal, for example, copper (Cu), ruthenium (Ru), nickel (Ni), cobalt (Co), chromium (Cr), iron (Fe), manganese (Mn), titanium (Ti), aluminum (Al), hafnium (Hi), tantalum (Ta), tungsten (W), Vanadium (V), Molybdenum (Mo), palladium (Pd), gold (Au), silver (Au), platinum PI, indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 603 of the metallization layer Mx are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In some embodiments, the composition of the conductive lines is analogous to the first material 110 described above.

Referring to FIG. 6, in some embodiments, portions of the conductive layer 503 are removed to even out top portions of the conductive lines 603 with top portions of the insulating layer 402 using a chemical-mechanical polishing ("CMP") technique known to one of ordinary skill in the art of microelectronic device manufacturing.

In one non-limiting example, the thickness of the conductive lines 603 is in an approximate range from about 15 nm to about 1000 nm. In one non-limiting example, the thickness of the conductive lines 603 is from about 20 nm to about 200 nm. In one non-limiting example, the width of the conductive lines 603 is in an approximate range from about 5 nm to about 500 nm. In one non-limiting example, the spacing (pitch) between the conductive lines 603 is from about 2 nm to about 500 nm. In more specific non-limiting example, the spacing (pitch) between the conductive lines 603 is from about 5 nm to about 50 nm.

In some embodiments, the lower metallization layer Mx is configured to connect to other metallization layers (not shown). In some embodiments, the metallization layer Mx is configured to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 7:
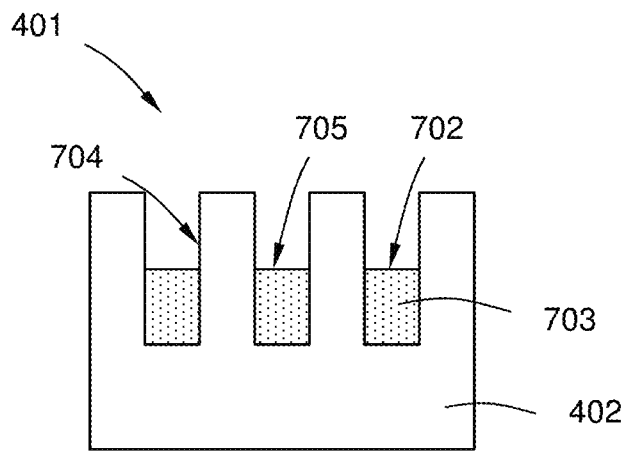
FIG. 7 is a cross-sectional view of the electronic device structure after the conductive lines are recessed according to some embodiments.

FIG. 7 is a view similar to FIG. 6, after the conductive lines 603 are recessed according to some embodiments. The conductive lines 603 are recessed to a predetermined depth to form recessed conductive lines 703. As shown in FIG. 7, trenches 702 are formed in the insulating layer 402. Each trench 702 has sidewalls 704 that are portions of insulating layer 402 and a bottom that is a top surface 705 of the recessed conductive line 603.

In some embodiments, the depth of the trenches 702 is from about 10 nm to about 500 nm. In some embodiments, the depth of the trenches 702 is from about 10% to about 100% of the thicknesses of the conductive lines. In some embodiments, the conductive lines 603 are recessed using one or more of wet etching, dry etching, or a combination of techniques known to one of ordinary skill in the art of electronic device manufacturing.

Figure 8:
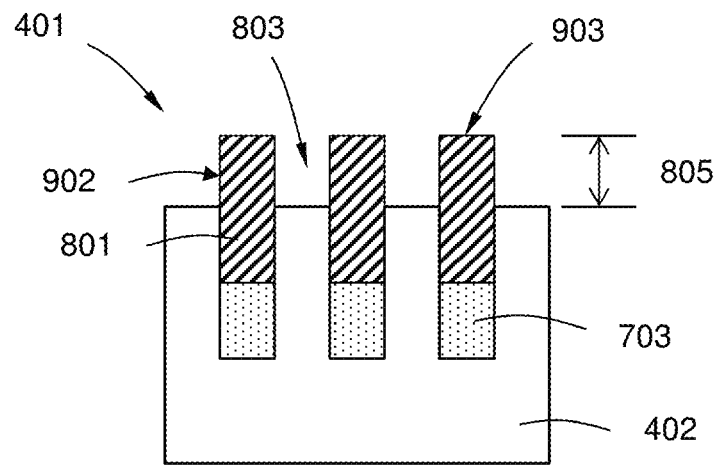
FIG. 8 is a cross-sectional view of the electronic device structure after carbon pillars are formed on the conductive lines according to some embodiments.

FIG. 8 is a view similar to FIG. 7 after self-aligned selective growth pillars 801 are formed on the recessed conductive lines 703 according to one or more embodiment. The self-aligned selective growth pillars 801 may be formed according to methods described herein for forming carbon pillars 330. As shown in FIG. 8, an array of the self-aligned selective growth pillars 801 has the same pattern as the set of the recessed conductive lines 703. As shown in FIG. 8, the pillars 801 extend substantially orthogonally from the top surfaces of the recessed conductive lines 703. As shown in FIG. 8, the pillars 801 extend along the same direction as the conductive lines 603. As shown in FIG. 8, the pillars 801 are separated by gaps 803. In some embodiments, the height 805 of the pillars 801 is in an approximate range from about 5 angstroms (Å) to about 10 microns (μm).

Figure 9:
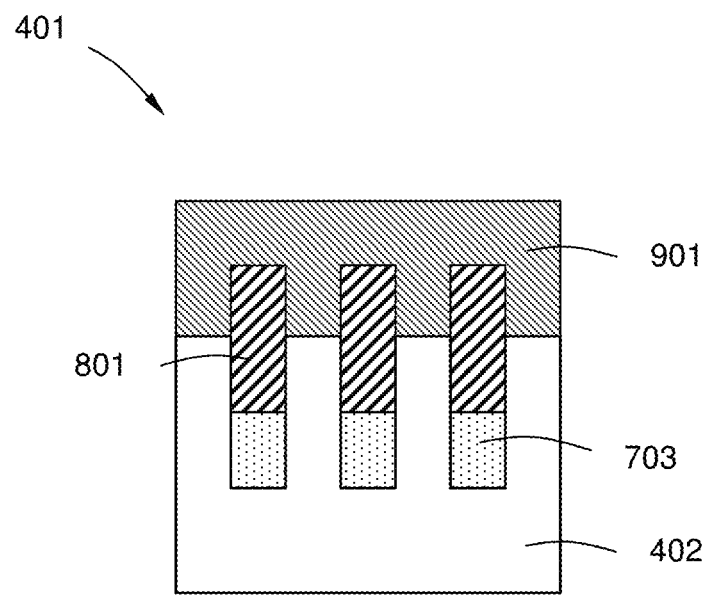
FIG. 9 is a cross-sectional view of the electronic device structure after a second insulating material is deposited around the carbon pillars according to some embodiments.

FIG. 9 is a view similar to FIG. 8, after a second insulating layer 901 is deposited to overfill the gaps between the pillars 801 according to some embodiments. For brevity, the second insulating layer 901 may also be referred to simply as the insulating layer 901. As shown in FIG. 9, insulating layer 901 is deposited on the opposing sides 902 and tops 903 of the pillars 801 and through the gaps 803 on the portions of the insulating layer 402 between the pillars 801.

In some embodiments, insulating layer 901 is a low-k gapfill layer. In one embodiment, insulating layer 901 is a flowable silicon oxide (FSiOx) layer. In some embodiments, insulating layer 901 is an oxide layer, e.g., silicon dioxide, or any other electrically insulating layer determined by an electronic device design. In some embodiments, insulating layer 901 is an interlayer dielectric (ILD). In some embodiments, insulating layer 901 is a low-k dielectric that includes, but is not limited to, materials such as, e.g., silicon dioxide, silicon oxide, a carbon based material, e.g., a porous carbon film, carbon doped oxide ("CDO"), e.g., carbon doped silicon dioxide, porous silicon dioxide, porous silicon oxide carbide hydride (SiOCH), silicon nitride, or any combination thereof. In some embodiments, insulating layer 901 is a dielectric material having k-value less than 3. In some embodiments, insulating layer 901 is a dielectric material having k-value in an approximate range from about 2.2 to about 2.7. In some embodiments, insulating layer 901 includes a dielectric material having k-value less than 2. In some embodiments, insulating layer 901 represents one of the insulating layers described above with respect to insulating layer 402.

In some embodiments, insulating layer 901 is a low-k interlayer dielectric to isolate one metal line from other metal lines. In some embodiments, insulating layer 901 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

Figure 10:
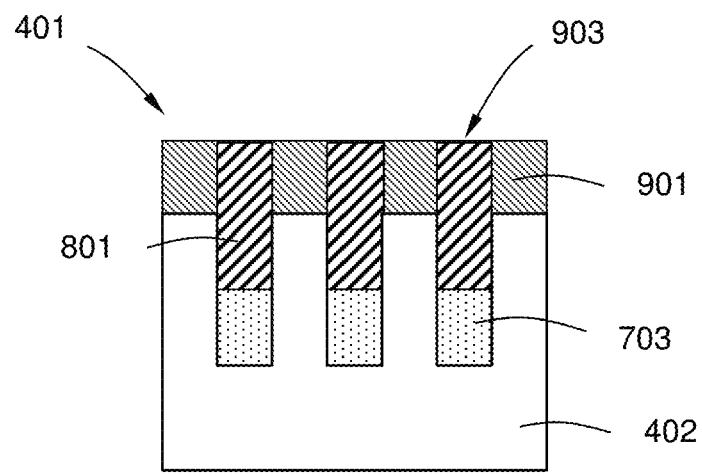
FIG. 10 is a cross-sectional view of the electronic device structure after the second insulating material is planarized according to some embodiments.

FIG. 10 is a view similar to FIG. 9 after chemical-mechanical planarization (CMP) of the second insulating layer 901 to expose the tops 903 of the pillars 801. The CMP process can be any suitable planarization process known to those skilled in the art. In some embodiments, the second insulating layer 901 is deposited so that the top of the insulating layer 901 is even with or slightly below the top 903 of the pillars 801 and the CMP process is not performed.

Figure 11:
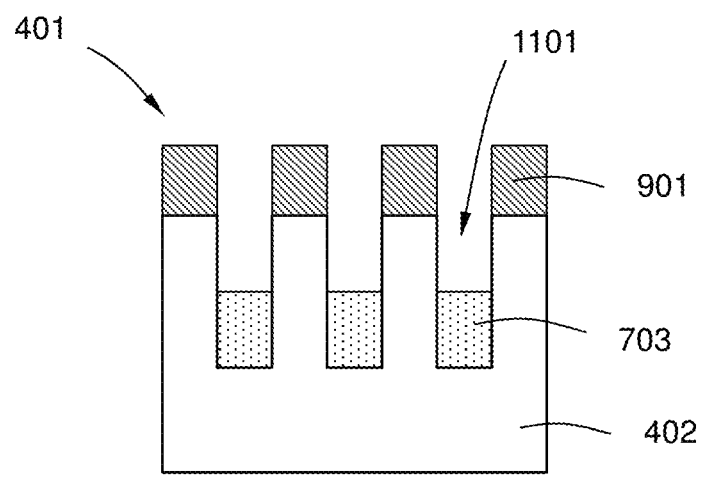
FIG. 11 is a cross-sectional view of the electronic device structure after the carbon pillars are removed to form trenches according to some embodiments.

FIG. 11 is a view similar to FIG. 10 after removing the pillars 801 to form trenches 1101. Etching can be performed in this part of the process, or any other part of the process incorporating an etch, by any suitable etch technique known to those skilled in the art. In some embodiments, the etch process is one or more of a dry etch or wet etch.

Figure 12:
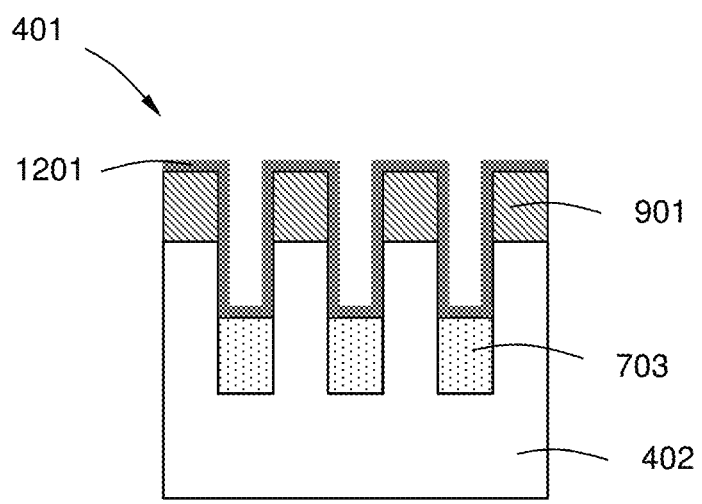
FIG. 12 is a cross-sectional view of the electronic device structure after an etch stop layer is deposited according to some embodiments.

FIG. 12 is a view similar to FIG. 11 after deposition of an etch stop layer 1201 on the second insulating layer 901. The etch stop layer 1201 is optional and may not be present in some embodiments. In some embodiments, the etch stop layer comprises $AlO_x$. Without being bound by theory, the etch stop layer 1201 may be particularly useful when the compositions of the second insulating layer 901 and the third insulating layer 1301 are similar.

Figure 13:
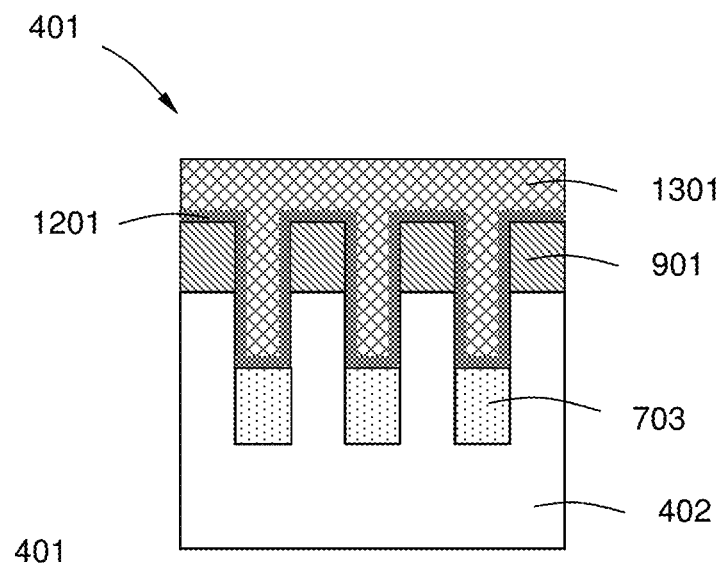
FIG. 13 is a cross-sectional view of the electronic device structure after a third insulating material is deposited on the etch stop layer to form filled trenches according to some embodiments.

FIG. 13 is a view similar to FIG. 12 after gap-filling the trenches 1101 with a third insulating layer 1301. The third insulating layer 1301 fills the trenches 1101 and contacts the etch stop layer 1201 (as shown) or the recessed conductive lines 703 (if no etch stop layer 1201 is present). The third insulating layer 1301 can be any suitable dielectric material as described above with regard to insulating layer 402 or second insulating layer 901. In some embodiments, the third insulating layer 1301 comprises a flowable film. In some embodiments, the flowable film comprises one or more of silicon oxide or silicon oxycarbide. In some embodiments, the third insulating layer 1301 comprises a spin-on low-k material.

In the embodiment shown in FIG. 13, the third insulating layer 1301 has a height greater than pillars 801. Stated differently, the thickness of the third insulating layer 1301 is sufficient to cover the pillars 801. In some embodiments, the third insulating layer 1301 is formed so that a top of the third insulating layer 1301 is substantially even with the pillars 801 or slightly below the top 903 of pillars 801.

Figure 14:
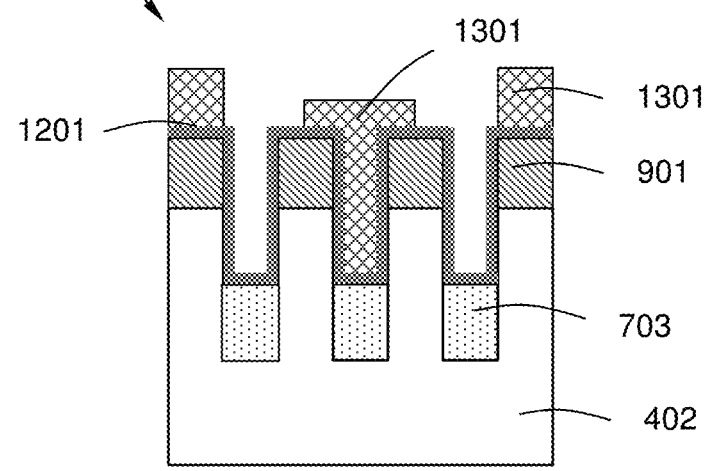
FIG. 14 is a cross-sectional view of the electronic device structure after the third insulating material and the etch stop layer are selectively removed from the filled trenches to form via openings according to some embodiments.

FIG. 14 is a view similar to FIG. 13 after selectively etching the third insulating layer 1301 and the etch stop layer 1201 (if present) to form via openings 1401 and expose the recessed conductive lines 703. In some embodiments, the third insulating layer 1301 may be selectively etched by a dual damascene etch process.

The dual damascene etch can be performed by any suitable method known to those skilled in the art. Briefly, a mask (not shown) is applied or positioned adjacent to insulting layer 1301 and the etch process is performed through the mask. The etch process extends through insulating layer 1301. The sides of the etch process can extend up to a side of the insulating layer 402 and the second insulating layer 901. The etch removes the etch stop layer 1201 between the adjacent stacks of insulating layer 402 and second insulating layer 901 to expose the recessed conductive lines 703. A top view would show a rectangular etch in insulating layer 1301 exposing the recessed conductive lines 703 with etch stop layer 1201 surrounding the via opening 1401.

Figure 15:
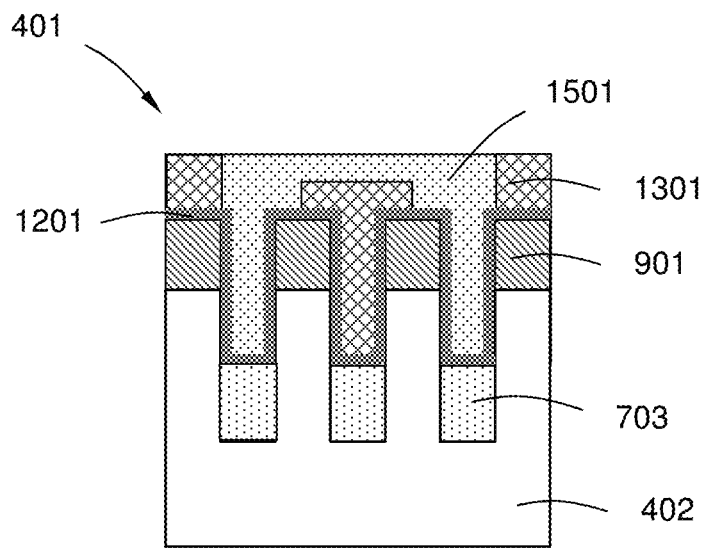
FIG. 15 is a cross-sectional view of the electronic device structure after a second conductive material is deposited in the via openings according to some embodiments.

FIG. 15 is a view similar to FIG. 14 after deposition of second conductive material 1501 in the via opening 1401. In some embodiments, the second conductive material 1501 is deposited to form second conductive lines which connect multiple via openings. The second conductive material 1501 can be any suitable metal and can be deposited by any suitable deposition technique. The second conductive lines extend in the second direction which is different than the first direction of the first conductive lines described above.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a carbon film, the method comprising:

exposing a substrate comprising an exposed first material surface and an exposed second material surface to a carbon precursor to form a carbon film with a first thickness on the exposed first material surface and a second thickness on the exposed second material surface, the first material comprising a metal, the carbon precursor comprising a carbon-containing species consisting essentially of carbon and hydrogen atoms, and the first thickness being greater than the second thickness.

2. The method of claim 1, wherein the metal comprises one or more of Ti, Co, Ni, Cu, Ru, Rh, Pd, Ag, Hf, Ta, W, Re, Ir, Pt, or Au.

3. The method of claim 1, wherein the first material comprises a substantially pure metal or metal alloy.

4. The method of claim 1, wherein the first material comprises a metal nitride, metal carbide, metal silicide, metal oxide, metal sulfide, metal selenide, metal telluride or combinations thereof.

5. The method of claim 1, wherein the second material comprises a dielectric material.

6. The method of claim 1, wherein the substrate is maintained at a temperature in a range of about 100° C. to about 700° C.

7. The method of claim 1, wherein the carbon precursor comprises one or more of $C_2H_2$, $C_2H_4$, $C_3H_6$, or $CH_4$.

8. The method of claim 1, wherein the carbon precursor further comprises hydrogen gas, nitrogen gas or argon gas.

9. A method of forming a carbon pillar, the method comprising:
exposing a substrate surface comprising a exposed first surface and a exposed second surface to a carbon precursor to form a carbon pillar comprising a carbon material on the exposed first surface, a first metal-containing material having the exposed first surface with a first dimension, a second dielectric material having the exposed second surface, the carbon precursor comprising a carbon-containing species consisting essentially of carbon and hydrogen atoms, the carbon pillar and the exposed first surface having the same first dimension.

10. The method of claim 9, wherein the first metal-containing material comprises cobalt.

11. The method of claim 9, wherein the carbon precursor comprises a C1-C4 hydrocarbon.

12. The method of claim 11, wherein the carbon precursor comprises at least one unsaturated bond.

13. The method of claim 9, wherein the carbon precursor further comprises hydrogen gas, nitrogen gas or argon gas.

14. The method of claim 9, wherein substantially no carbon material is deposited on the exposed second surface.

15. The method of claim 9, wherein the substrate is maintained at a temperature in a range of about 100° C. to about 700° C.

16. The method of claim 9, wherein the exposed first surface is recessed from the exposed second surface to form a substrate feature, the substrate feature comprising at least one sidewall of the
second dielectric material and the exposed first surface of the first metal-containing material, the carbon pillar extending above the exposed second surface.

17. The method of claim 16, wherein the carbon pillar has sides substantially orthogonal to the substrate surface.

18. A method of forming a self-aligned via, the method comprising:
recessing first conductive lines on a first insulating layer on a substrate, the first conductive lines extending along a first direction on the first insulating layer;
forming carbon pillars on the recessed first conductive lines;
depositing a second insulating layer between the carbon pillars;
removing the carbon pillars to form trenches in the second insulating layer;
depositing a third insulating layer in the trenches onto the recessed first conductive lines to form filled trenches; and
selectively etching the third insulating layer from the filled trenches to form a via opening to the first conductive line.

19. The method of claim 18, further comprising depositing a substantially conformal etch stop layer after removing the carbon pillars and before depositing the third insulating layer.

20. The method of claim 18, further comprising
depositing a second conductive material into the via opening.

* * * * *